United States Patent
Sollish et al.

[11] Patent Number: 6,029,259
[45] Date of Patent: Feb. 22, 2000

[54] METHOD AND SYSTEM FOR AUTHENTICATING DIGITAL OPTICAL MEDIA

[75] Inventors: Baruch Sollish, Emmanuel, Israel; Craig Schwarz, Churchville, N.Y.

[73] Assignee: T.T.R. Technologies Ltd., Kfar-Saba, Israel

[21] Appl. No.: 09/103,682

[22] Filed: Jun. 15, 1998

[51] Int. Cl.$^7$ ................................................. G11C 29/00
[52] U.S. Cl. ............................................ 714/719; 714/718
[58] Field of Search ..................................... 714/719, 718

[56] References Cited

U.S. PATENT DOCUMENTS

| | | | |
|---|---|---|---|
| 5,400,319 | 3/1995 | Fite et al. ............................. | 369/275.5 |
| 5,563,947 | 10/1996 | Kikimis ................................ | 380/4 |
| 5,590,768 | 1/1997 | Hilton et al. ......................... | 206/308.1 |
| 5,703,858 | 12/1997 | Mitchell et al. ..................... | 369/58 |

*Primary Examiner*—Phung M. Chung
*Attorney, Agent, or Firm*—Darby & Darby

[57] ABSTRACT

A method for authenticating a digital optical medium to determine if it is original or an unauthorized copy. One or more special bistable data subunits are written onto the original digital optical medium by recording bistable data symbols and other intentional errors into the data subunit such that the data subunit will be on the error-correction limit threshold. A bistable data symbol is a data symbol for which a player will randomly read at least two different values. Depending on which values are read for the bistable data symbols, the bistable data subunit will either be error-free and readable (at or below the error-correction limit) or will be erroneous or unreadable (above the error-correction limit). When an unauthorized copy of the digital optical medium is made, the data subunit with the address of the bistable data subunit on the original digital optical medium will be a monostable data subunit with constant data, because special hardware equipment is needed to record bistable data symbols. Thus, by testing the stability of the appropriate data subunits, the undetermined digital optical medium can be authenticated as either original or an unauthorized copy. Methods for writing a bistable data subunit include replacing one or more data symbols in the data subunit with bistable data symbols and zero or more data symbols in the data subunit with erroneous data symbols. Methods for testing the stability of a data subunit include multiple readings and checking for error as well as measuring the time for a successful read using a player with a multiple retry capability.

8 Claims, 10 Drawing Sheets

METHOD AND SYSTEM FOR AUTHENTICATING DIGITAL OPTICAL MEDIA

FIELD AND BACKGROUND OF THE INVENTION

The present invention relates to a method and system for media authentication and, more particularly, to a method and system for authenticating digital optical media.

Digital optical media includes, but is not limited to, media such as Compact Disc (CD), Compact Disc Read-Only Memory (CD-ROM), and Digital Video Disc (DVD). Digital optical media are well-known in the art and have become the media of choice for a broad variety of important data storage and information distribution applications. In particular, certain proprietary materials such as computer software, specialized data, and audio/video content are commonly sold and distributed on digital optical media.

Digital optical media technology is established according to a series of international publications, herein referred to as "standards", all of which are incorporated herein by reference as if set forth fully herein. For example, some common standards applicable to CD's include: the International Standards Organization (ISO) standard 9660 entitled "Information Processing—Volume and File Structure of CD-ROM for Information Interchange, ISO Standard 13490-1", the International Electrotechnique Commission (CEI-IEC) standard 908, generally conforming to what is known as the "Red Book", and ISO/IEC 10140, generally conforming to what is known as the "Yellow Book".

Software and document data may be read and utilized by a computer from digital optical media, and there are widely-available players for reading data from digital optical media and using this data to reconstruct audio, visual, text, and audio-visual information. The term "player" herein denotes any device which is able to read data from digital optical media. Players include, but are not limited to, CD players, CD-ROM multi-media players, game-playing systems, and DVD players, which can reproduce sound, images, and text from data stored on digital optical media. Some computers are also configured with hardware and software capable of accessing digital optical media, to duplicate the functionality of CD players, CD-ROM multi-media players, game-playing systems, and DVD players.

Unfortunately, it is easy to copy proprietary material from an original digital optical medium and thereby produce an unauthorized copy whose sale and distribution cannot be controlled by the owner of the proprietary material. Individual users can freely copy such proprietary material using low-cost consumer devices such as CD-R recorders, and it is also possible to mass-produce unauthorized copies of proprietary material using commercial mastering equipment. It is usually difficult or impossible to enforce copyright laws in such cases, and the legitimate owner of the proprietary material is thereby deprived of the legal right to control the sale and distribution of the proprietary material. The term "original" as used herein refers to an instance of a digital optical medium which has been authorized by and issued under the control of the owner of the proprietary material recorded thereon. In contrast, the term "unauthorized copy" herein denotes an instance of a digital optical medium which has derived from an original digital optical medium via copying that has neither been authorized by nor is under control of the owner of the proprietary material recorded thereon.

Thus, there is a widely-recognized need for a means of distinguishing an original digital optical medium from an unauthorized copy, and especially, there is a widely-recognized need for a means of automatically distinguishing an original digital optical medium from an unauthorized copy. The term "automatically distinguish" herein denotes a means of distinguishing an original digital optical medium from an unauthorized copy in such a way that does not require visual inspection or other human intervention. In particular, automatically distinguishing an original digital optical medium from an unauthorized copy should be feasible by a player as it reads the digital optical medium. That is, whatever distinguishing features are placed on an original digital optical medium for identification as original, the distinguishing features must be machine-readable. The terms "authenticate" and "authenticating" herein refer to any process by which an undetermined digital optical medium corresponding to an original digital optical medium can be differentiated to be an original digital optical medium as distinct from an unauthorized copy of an original digital optical medium. The term "undetermined" herein denotes that a specific instance of a digital optical medium is not yet known to be an original digital optical medium as distinct from an unauthorized copy. The term "corresponding to" herein denotes that a specific instance of a digital optical medium contains the same functional data as a given original digital optical medium.

In addition to allowing a player to identify the digital optical medium being played as an original rather than an unauthorized copy, a method for authenticating an undetermined digital optical medium can allow the player to selectively access proprietary material only if the digital optical medium is an original, and deny access to the proprietary material if the digital optical medium is an unauthorized copy. Such selective access is a means of copy protection, and can be implemented through various techniques known in the art, such as by encrypting the proprietary material and storing a decryption key on the original digital optical medium in such a way that the decryption key is not readily copyable. The presence of a valid decryption key on a digital optical medium therefore is intended to automatically distinguish the digital optical medium as original, and moreover to provide copy protection by allowing the player access to the proprietary material only if the digital optical medium is original. The term "copy protection" herein denotes any method or system which either prevents the making of an unauthorized copy or renders an unauthorized copy useless for its intended application.

There are currently a number of schemes which attempt to automatically distinguish an original digital optical medium from an unauthorized copy by storing a special pattern, such as a decryption key, on the digital optical medium in such a way that the special pattern is not readily copyable. For example, U.S. Pat. No. 5,400,319 to Fite et al. ("CD-ROM with Machine-Readable I.D. Code") discloses the use of a laser to selectively destroy portions of the reflective layer of the CD-ROM, thereby creating addressable defects in which a serial number may be encoded. U.S. Pat. No. 5,563,947 to Kikinis ("CD-PROM") discloses a similar use of a laser to physically damage selected sectors and thereby produce a pattern of unreadable sectors in which a decryption key may be stored. And U.S. Pat. No. 5,703,858 to Mitchell et al. ("System for Encoding a Glass Master to Enable Detection of a Counterfeit Optical CD-ROM") discloses the use of a high-frequency random modulation of a laser to produce random defects in the CD-ROM at the master level by selective destruction of redetermined sectors. All of these techniques, as well as other currently-available commercial techniques for copy-protecting digital optical media, involve creating damaged, invalid, or otherwise unreadable portions of the digital optical medium. The theory behind such techniques is that ordinary consumer recording equipment is not intended to be able to produce defects in the copies and therefore an unauthorized copy produced on such equipment should lack the unreadable areas in which the decryption key or other pattern is encoded. If this were in fact reliably the case, then such techniques would provide means for authenticating an undetermined digital optical medium. The present applicants, however, have found that it is possible to reproduce unreadable sectors in a copy by using ordinary consumer recording equipment with the appropriate software. Thus, a person with access to the proper software would be able to easily defeat such schemes relying on unreadable sectors and thereby create an unauthorized copy of a digital optical medium which will be incorrectly discerned by these authenticating schemes to be an original digital optical medium. In effect, all the schemes currently known in the art for providing copy protection of digital optical media by encoding patterns in damaged or unreadable data areas are of limited value in distinguishing an original digital optical medium from an unauthorized copy and offer only limited protection against making unauthorized copies.

Therefore, it would be highly advantageous to have a method and system for authenticating an undetermined digital optical medium which cannot be defeated utilizing commercially-available copying equipment, regardless of the software employed. This goal is met by the present invention.

SUMMARY OF THE INVENTION

The present invention relies on the fact that the standards specify certain error-correction limits on the ability of digital optical media to tolerate errors. The standards provide for error correction by specifying error-correction data subunits which contain redundant information that can be used to reconstruct damaged or missing data. The term "data subunit" herein denotes any set of data symbols grouped together according to the appropriate standards for the digital optical medium. The term "data symbol" herein denotes the primitive data element defined according to the appropriate standards for the digital optical medium. For example, the standards for Compact Disc specify data symbols corresponding to a byte (8 binary digits). The term "error-correction data subunit" herein denotes any set of data symbols grouped together for error-correction purposes according to the appropriate standards for the digital optical medium. Typically, an error-correction data subunit may be contained within a larger data subunit, and all the data symbols and data subunits of a digital optical medium are addressable. The term "addressable" herein refers to the property of a data symbol or data subunit on a digital optical medium that allows a player of the digital optical medium to locate and read a specific predetermined data symbol or data subunit. That is, the specific predetermined data symbol or data subunit has a unique machine-accessible location or "address". For example, a data subunit of a Compact Disc is a "sector", an error-correction data subunit of a Compact Disc is a "C2 codeword", and each such data subunit has a unique numerical address. At or below the error-correction limit for an error-correction data subunit, the player must be able to correct errors and read the error-correction data subunit error-free. Above this error-correction limit, however, the error-correction data subunit (or a containing data subunit) with errors cannot be read, or optionally (depending on the player) the error-correction data subunit or the containing data subunit will be read with reported or detectable errors. For example, the standards for Compact Disc furthermore specify that a C2 codeword be correctable with up to 2 errors. That is, the error-correction limit for a C2 codeword is 2. At or below this error-correction limit, the player can correct errors to read a C2 codeword without any errors at all. Above this error-correction limit, however, the player is unable to correct the errors and will report an "E32" uncorrectable error condition. This error may affect the readability of the entire sector in which the C2 codeword is located.

Figure 3:
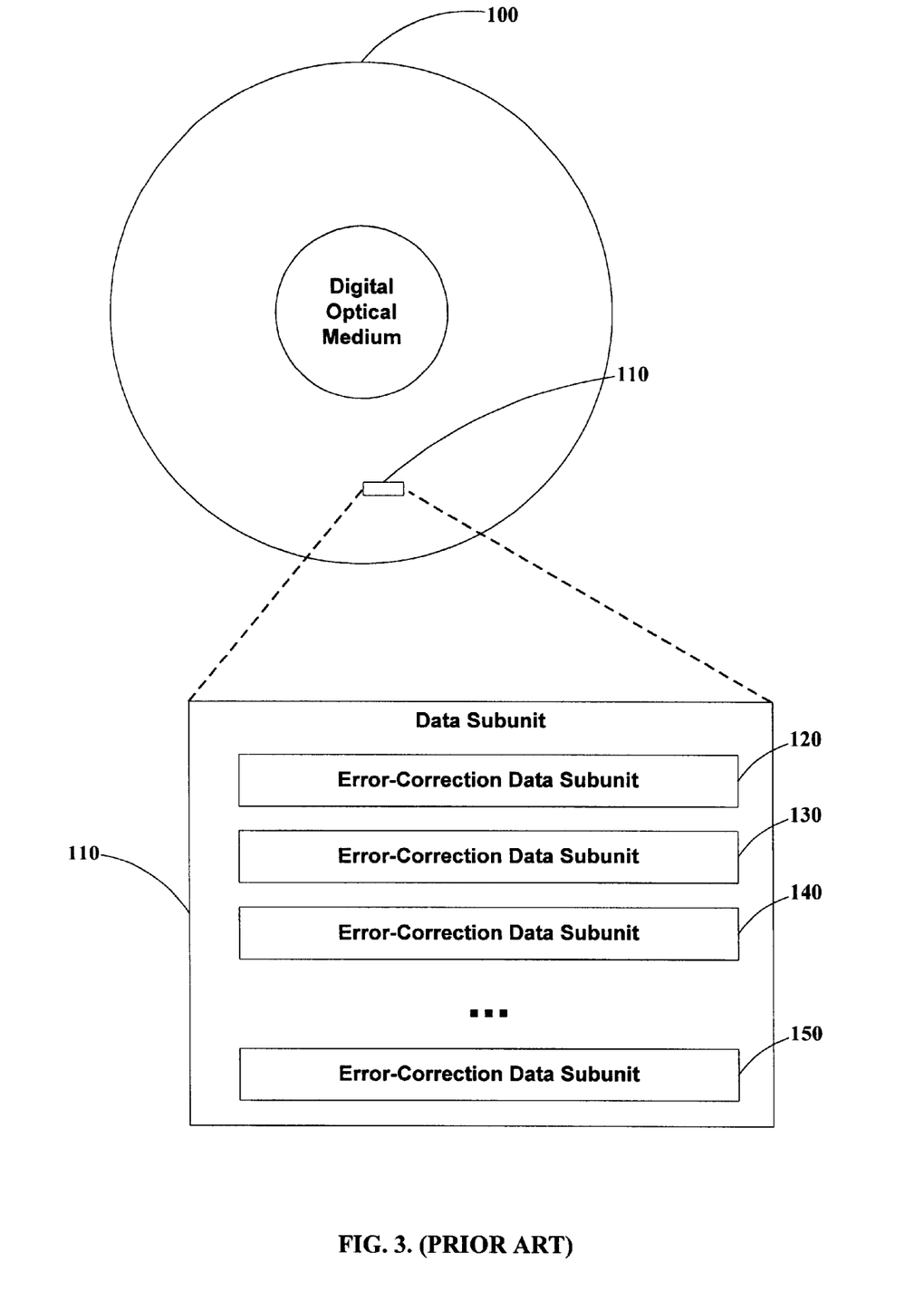
FIG. 3 shows the makeup of a data subunit on a prior art digital optical medium.
Figure 4:
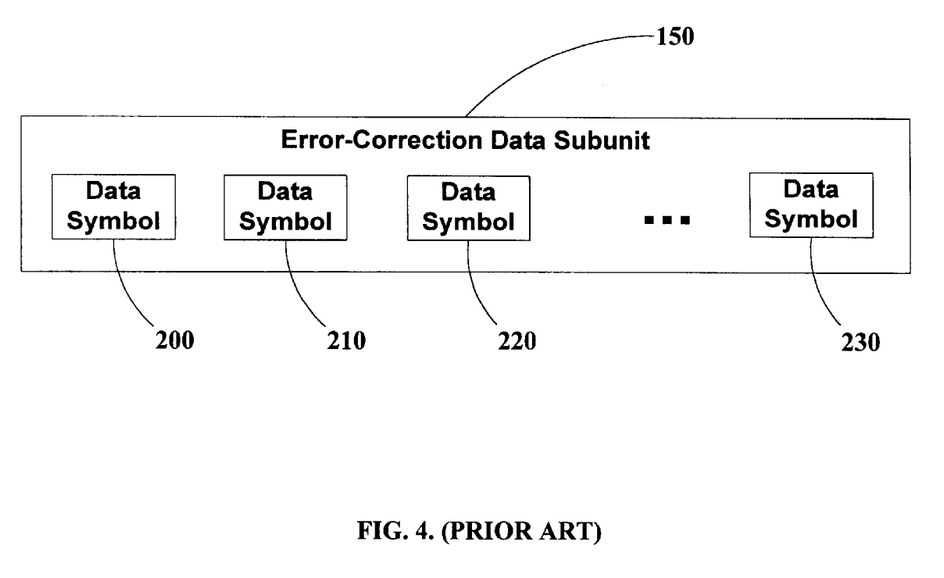
FIG. 4 shows the makeup of an error-correction data subunit of a prior art digital optical medium.

FIG. 3, to which reference is now briefly made, shows a prior art digital optical medium having a data subunit 110 containing a number of error-correction data subunits 120, 130, 140, and 150. FIG. 4, to which reference is now briefly made, shows prior art error-correction data subunit 150 containing a number of data symbols 200, 210, 220, and 230.

The term "bistable" herein denotes data recorded on digital optical media which randomly assumes one of at least two distinctly different states upon reading. Thus, for example, a bistable data symbol is a data symbol which randomly assumes one of at least two distinctly different values upon reading. In contrast, the term "monostable" herein denotes data recorded on digital optical media which always assumes the same state upon reading. Thus, a monostable data subunit always reads with the same data contents no matter how many times it is read. By recording special bistable data symbols and other deliberate errors within error-correction data subunits, it is possible to record bistable error-correction data subunits which upon reading randomly appear either to be at or to be above the error-correction limit for the error-correction data subunit. The term "stability" herein denotes the property of any specific data subunit as being either monostable or bistable. Ordinarily, equipment used to record digital optical media is capable of writing only monostable data. Special hardware equipment is required to write bistable data on digital optical media.

A bistable data symbol is, in effect, a data symbol with an invalid code that produces an ambiguous output. Methods of creating such a bistable data symbol are covered in a co-pending U.S. patent application Ser. No. 08/689,209 filed Aug. 5, 1996, which is incorporated by reference as if fully set forth herein.

When writing a bistable error-correction data subunit containing a bistable data symbol, one of the values of the bistable data symbol is the correct value that the data symbol should take, and when the bistable data symbol assumes this correct value the bistable error-correction data subunit will not exceed the error-correction limit and will therefore be readable without error. The other values of the bistable data symbol, however, are erroneous values, and when the bistable data symbol assumes an erroneous value, the bistable error-correction data subunit containing the bistable data symbol will exceed the error-correction limit, and will therefore be either unreadable or will be read with reported or detectable errors. If necessary, additional bistable data symbols and/or erroneous monostable data symbols are written to the data subunit in order to either exceed or not exceed the error-correction limit. Since writing bistable data symbols requires special hardware equipment, ordinary consumer recorders of digital optical media cannot reproduce them, regardless of the software employed. Thus, an unauthorized copy of a digital optical medium will contain only ordinary monostable data symbols, which always yield the same value upon reading. Consequently, an unauthorized copy of a digital optical medium will contain only ordinary monostable data subunits. An unauthorized copy can therefore be automatically distinguished from an original digital optical medium, since the original digital optical medium has at least one bistable data subunit which randomly reads either without errors or with errors, whereas every data subunit of an unauthorized copy is monostable and will either always read the same way—either always without errors or always with errors.

By recording an original digital optical medium with a bistable data subunit, it is possible to authenticate an undetermined digital optical medium corresponding to the original digital optical medium by testing the undetermined digital optical medium to ascertain the stability of the data subunit with the same address as a bistable data subunit on the original digital optical medium. If the data subunit on the undetermined digital optical medium is bistable then the undetermined digital optical medium is an original digital optical medium. Otherwise, if the data subunit is monostable, then the undetermined digital optical medium is an unauthorized copy.

Therefore, according to the present invention there is provided a method for authenticating an undetermined digital optical medium corresponding to an original digital optical medium, including the steps of: (a) writing at least one addressable bistable data subunit on the original digital optical medium, the addressable bistable data subunit having a predetermined address; (b) testing the stability of an addressable data subunit of the undetermined digital optical medium having the same address as the predetermined address; and (c) determining the undetermined digital optical medium to be an original digital optical medium if the result of the testing is that the stability is bistable, and determining the undetermined digital optical medium to be an unauthorized copy if the result of the testing is that the stability is monostable.

According to a preferred embodiment of the present invention, it is possible to determine the stability of a data subunit by making multiple readings of the data subunit. If the multiple readings have differing results (some with errors and some without errors), then the data subunit is bistable and the undetermined digital optical medium being authenticated is an original digital optical medium. Otherwise, if the multiple readings have identical results (all with errors or all without errors), then the data subunit is monostable and the undetermined digital optical medium being authenticated is an unauthorized copy. In another embodiment of the present invention, the data returned from a series of read attempts is compared. For certain players, a bistable data subunit will return different data values on subsequent read operations, and this fact can sometimes be used to determine the stability. In yet another embodiment of the present invention, a player's built-in retry capabilities are utilized to attempt to read the data subunit. Some players have the ability to make repeated attempts to read a data subunit if the initial attempt is unsuccessful on account of errors. The time required to read a data subunit corresponding to a bistable data subunit on an original digital optical medium and return valid data is measured and compared against that required to read a known monostable data subunit. If the time to read the data subunit corresponding to a bistable data subunit is not substantially greater than the time to read a known monostable data subunit, the data subunit corresponding to a bistable data subunit on an original digital optical medium is a monostable data subunit and the digital optical medium is determined to be an unauthorized copy. Likewise, if the player cannot read the data subunit at all, then it is also a monostable data subunit and the digital optical medium is determined to be an unauthorized copy. Only if the player takes substantially longer to read the data subunit corresponding to a bistable data subunit on an original digital optical medium than for reading a known monostable data subunit is the data subunit bistable, in which case the digital optical medium is determined to be an original.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method for automatically distinguishing an original digital optical medium from an unauthorized copy. Specifically, the present invention can be used to authenticate an original digital optical medium, either purely for identification of unauthorized copies, or to provide a basis for copy-protecting proprietary material on an original digital optical medium.

The principles and operation of a method and system according to the present invention may be better understood with reference to the drawings and the accompanying description.

Figure 1:
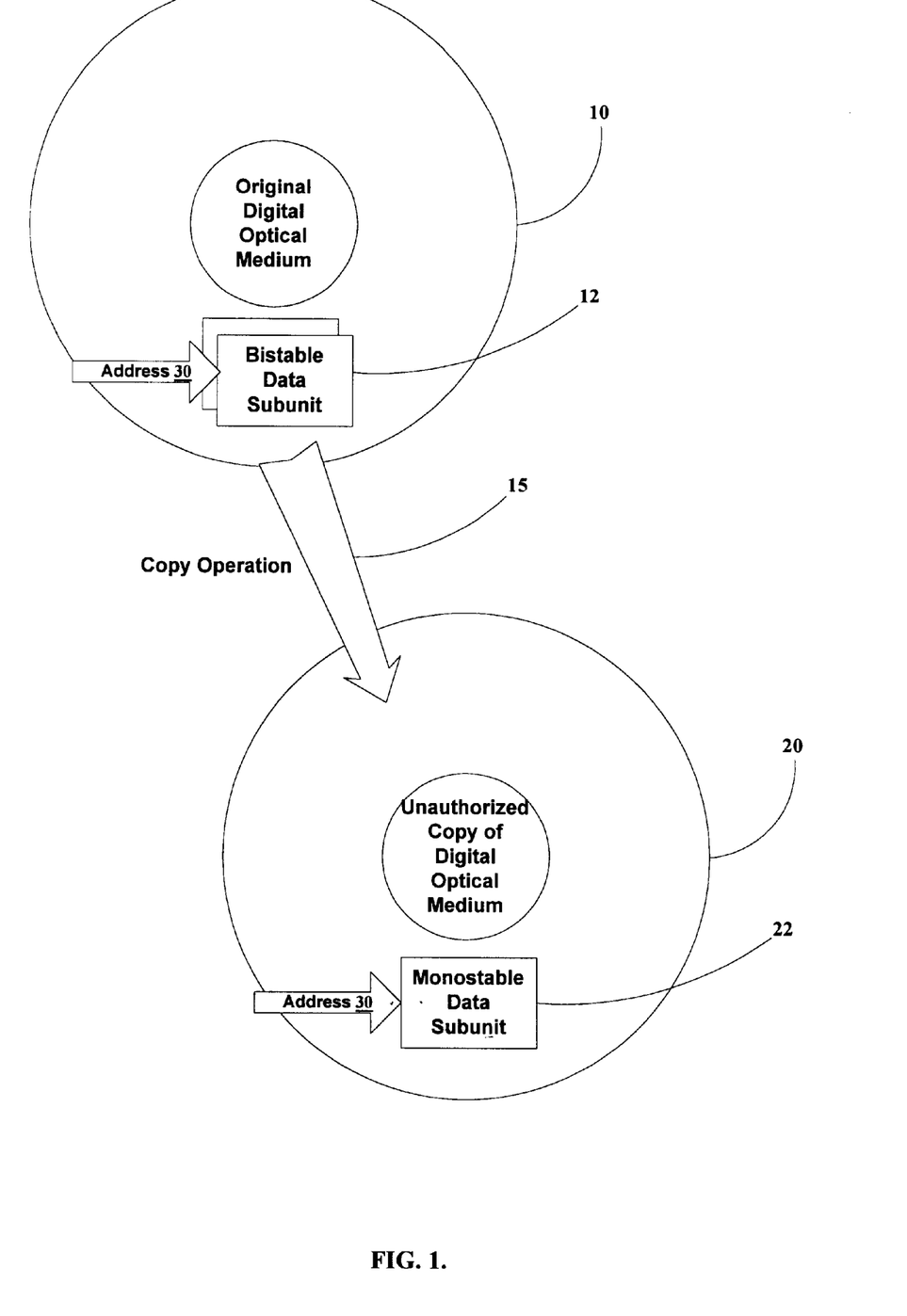
FIG. 1 shows the basic elements of authenticating digital optical media.

Referring now to the drawings, FIG. 1 shows what happens an original digital optical medium 10 containing a bistable data subunit 12 with an address 30 undergoes a copy operation 15 to produce an unauthorized copy 20 of a digital optical medium corresponding to original digital optical medium 10. It is seen that unauthorized copy 20 contains a monostable data subunit 22 also having address 30. The only difference between the original digital optical medium 10 and unauthorized copy 20 that can be automatically distinguished is that data subunit 22 in the unauthorized copy is monostable rather than bistable as is data subunit 12 in the original digital optical medium.

Figure 2:
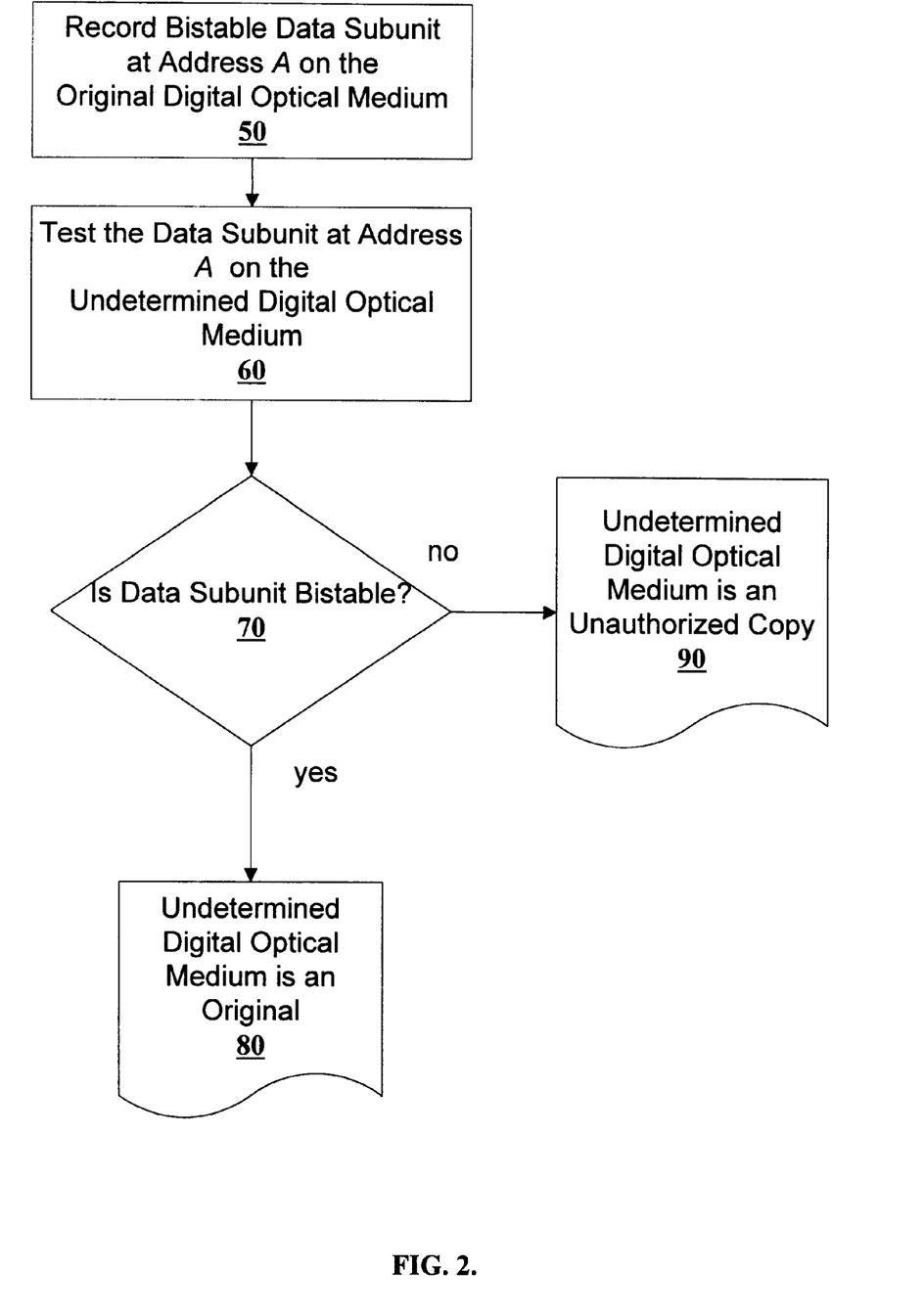
FIG. 2 is a flowchart showing the steps in authenticating an undetermined digital optical medium according to the present invention.

FIG. 2 is a flowchart showing the general steps of the authentication method according to the present invention. In a step 50, a bistable data subunit is recorded onto the original digital optical medium at an address A. In a step 60, the undetermined digital optical medium is tested to determine the stability of the data subunit at address A. Then, at a decision point 70, the method concludes with a result 80 that the undetermined digital optical medium is an original digital optical medium if the stability is bistable and with a result 90 that the undetermined digital optical medium is an unauthorized copy if the stability is not bistable (i.e., the stability is monostable).

Figure 5:
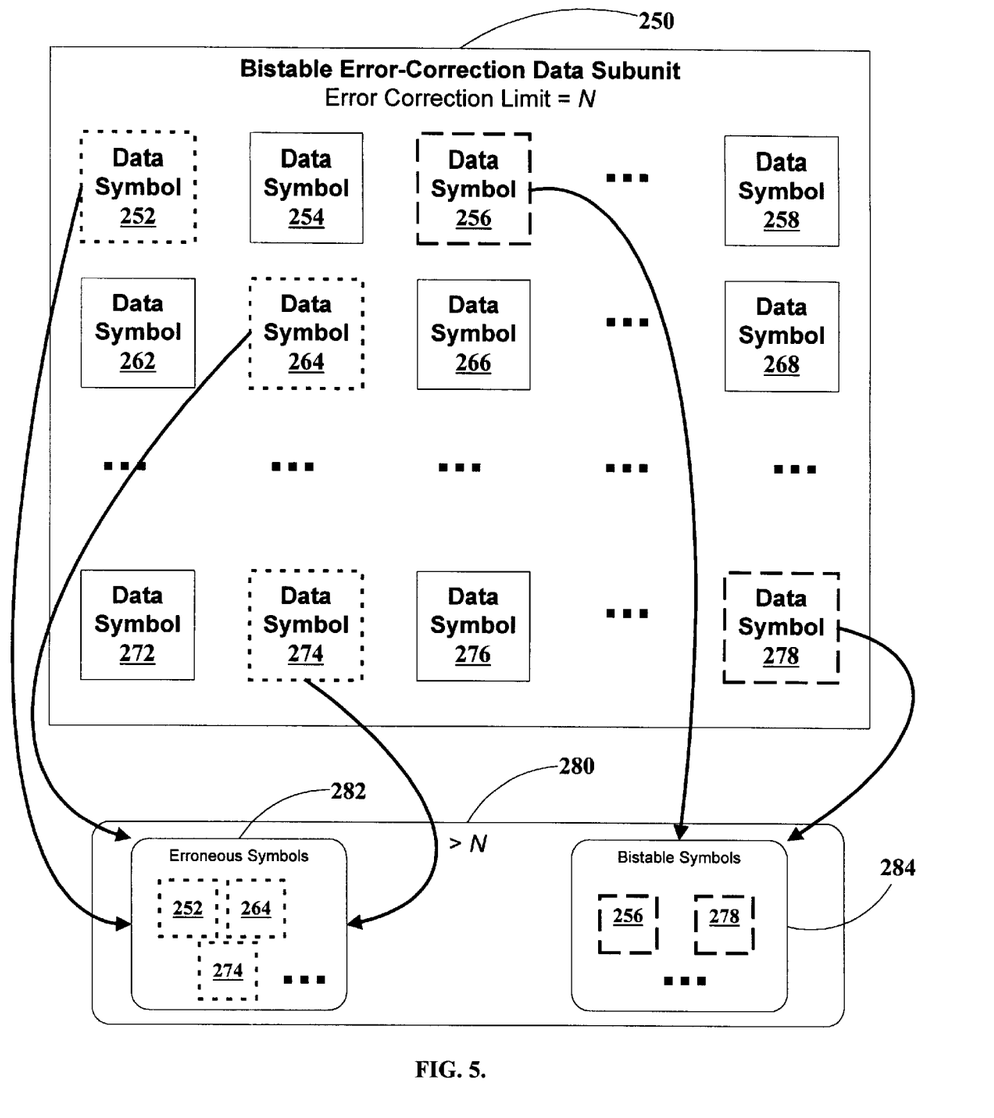
FIG. 5 illustrates a general example of the makeup of a bistable error-correction data subunit of a digital optical medium according to the present invention.

FIG. 5 illustrates a general example of the makeup of a bistable error-correction data subunit 250 according to the present invention. Bistable error-correction data subunit 250 has an error-correction limit of N, meaning that error-correction data subunit 250 may contain up to N errors in arbitrary data symbols and still be readable without error. That is, up to N arbitrary data symbol errors may be corrected within error-correction data subunit 250. In this example, bistable error-correction data subunit 250 contains data symbols 252, 254, 256, 258, 262, 264, 266, 268, 272, 274, 276, and 278. The ellipsis ( . . . ) indicates that additional data symbols may in general also be present. In this example, the bistable properties of bistable error-correction data subunit 250 are based on the fact that data symbols 256 and 278 are bistable data symbols. Data symbols 256 and 278 were arbitrarily chosen from the data symbols in error-correction data subunit 250 to be written as bistable, and are contained within a subgroup 284. The ellipsis ( . . . ) within subgroup 284 indicates that in general additional bistable data symbols may be contained there. Moreover, data symbols 252, 264, and 274 were arbitrarily chosen from the data symbols in error-correction data subunit 250 to be written as erroneous data symbols, and are contained within a subgroup 282. The ellipsis ( . . . ) within subgroup 282 indicates that in general additional erroneous data symbols may be contained there. Subgroup 282 and subgroup 284 constitute a group 280 which contains more than N data symbols (the number of data symbols in group 280 is >N). In general, subgroup 282 is the complement of subgroup 284 in group 280. That is, group 280 consists exactly of the union of subgroup 282 and subgroup 284. Likewise, subgroup 284 is the complement of subgroup 282 in group 280. Furthermore, subgroups 282 and 284 are mutually exclusive. That is, no data symbol in subgroup 282 is also contained in subgroup 284. Moreover, there must be at least one bistable data symbol in subgroup 284, and the number of erroneous data symbols in subgroup 282 cannot be greater than N. Subgroup 282, however, may be empty, in which case group 280 consists entirely and solely of subgroup 284 (that is, group 280 equals subgroup 284). In practice, a variety of arbitrary selections of data symbols for subgroups 282 and 284 is possible. These conditions insure that error-correction data subunit 250 will be bistable. Depending on the read states of bistable data symbols in subgroup 284, error-correction data subunit 250 reads with N or fewer errors, in which case the read operation returns error-correction data subunit 250 without errors, or error-correction data subunit 250 reads with more than N errors, in which case the read operation is unsuccessful because the error-correction limit of error-correction data subunit 250 is exceeded.

Figure 6:
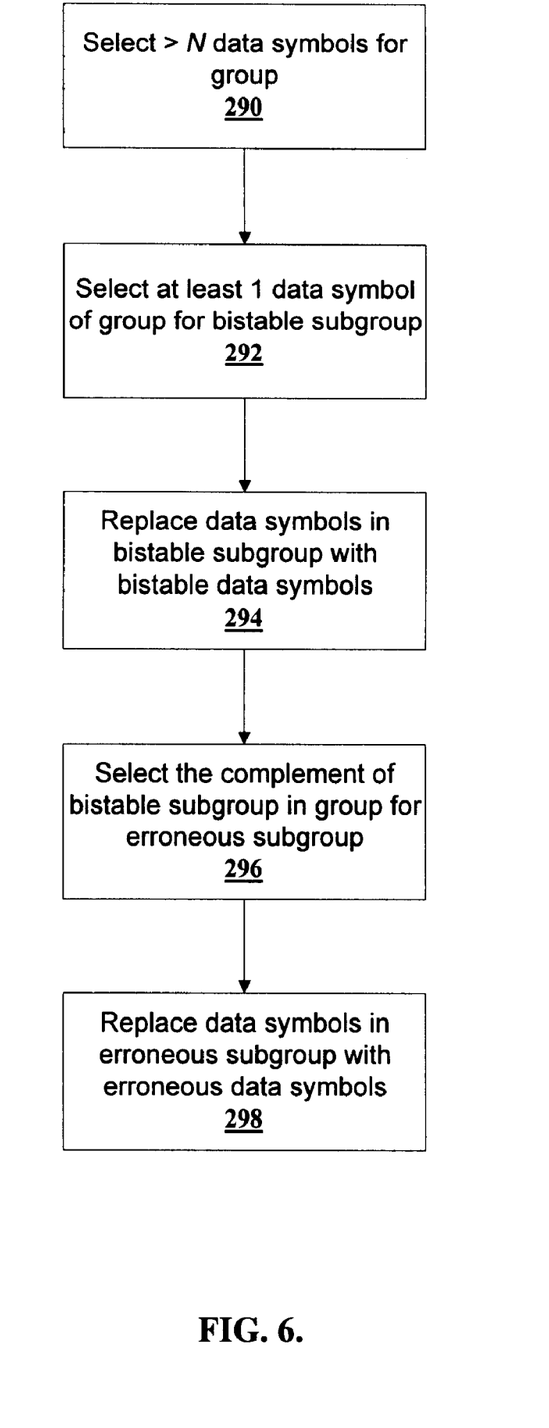
FIG. 6 is a flowchart showing the steps in writing a bistable data subunit according to the present invention.

FIG. 6 is a flowchart showing the method according to the present invention for writing a bistable data subunit such as bistable error-correction data subunit 250 (FIG. 5). In a step 290 a number >N of data symbols are selected for group 280 (FIG. 5). Then, in a step 292 at least one data symbol of group 280 (FIG. 5) is selected for bistable subgroup 284 (FIG. 5). Then, in a step 294 the data symbols of bistable subgroup 284 (FIG. 5) are replaced with bistable data symbols. Then, in a step 296 the complement of bistable subgroup 284 (FIG. 5) is selected for erroneous subgroup 282 (FIG. 5). Finally, in a step 298 the data symbols of erroneous subgroup 282 are replaced with erroneous data symbols.

Figure 7:
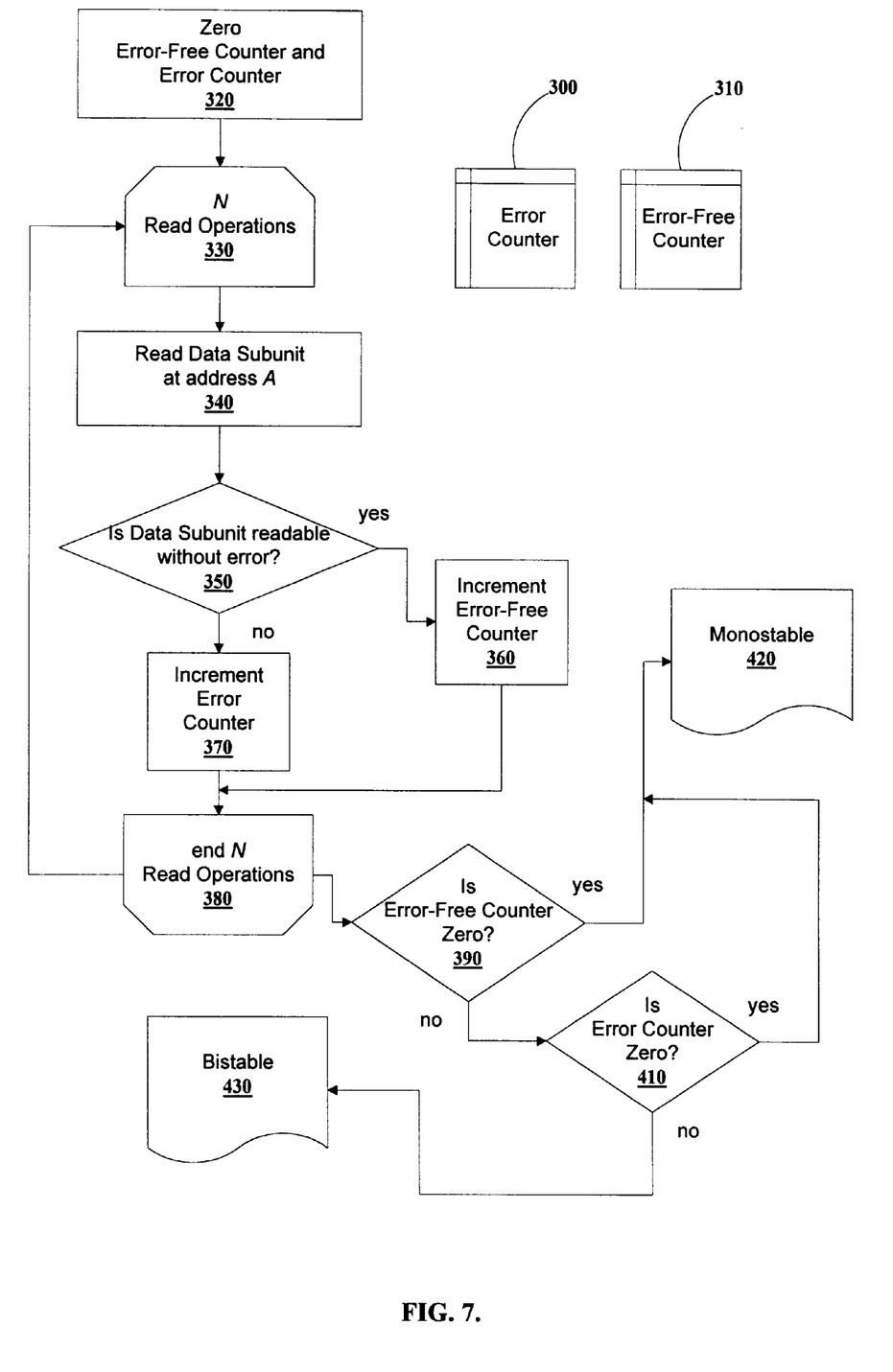
FIG. 7 is a flowchart showing the steps in determining data subunit stability by multiple reading operations to check for errors.

FIG. 7 is a flowchart showing the steps of an embodiment according to the present invention for determining the stability of a data subunit of the data subunit at address A. Recalling that a bistable data subunit randomly returns different data when read, it is seen that it is necessary to classify the returned data into groups of different potential responses. If the actual responses of the read operations result in returned data of different classifications, then the data subunit is determined to be bistable. Otherwise, if all the actual responses of the read operations result in returned data of the same classification, then the data subunit is determined to be monostable. For this example, the different potential responses are classified as being either "error-free" or "error". The steps of this portion of the method according to the present invention therefore require two counters, an error counter 300 and an error-free counter 310. In a first step 320, error-free counter 310 and error counter 300 are zeroed. Following this is a loop 330–380 of N read operations. The purpose of the N read operations is to determine the stability by repeatedly attempting to read the data subunit at address A. If the data subunit is bistable, The number N must clearly be greater than 1, for otherwise it will be impossible to detect different values upon reading the data subunit. The larger N becomes, the more likely will be the probability that a bistable data subunit will return different values, and the more statistically significant will be a result that the data subunit is monostable. On the other hand, the larger N becomes, the more time is required for reading. In practice, a value of N=5 is usually sufficient. Within loop 330–380 there is a read operation 340 which attempts to read the data subunit at address A. Following is a decision point 350 where the results of the read attempt are analyzed. If the data subunit is readable without error, a step 360 increments error-free counter 310. Otherwise, if the data subunit is not readable without error, a step 370 increments error counter 300. After loop 330–380 completes, a decision point 390 checks error-free counter 310 for a zero count. If error-free counter 310 is zero, then all of the read responses were the same (all erroneous), and the result of the test is that the data subunit with address A is monostable, at a result 420. Otherwise, a decision point 410 checks error counter 300 for a zero count. If error counter 300 is zero, then all the read responses were the same (all error-free) and the result of the test is that the data subunit with address A is monostable, also at result 420. Otherwise, some of the read responses were erroneous and some were error-free, and the result of the test is that the data subunit with address A is bistable, at a result 430. Only if both error counter 300 and error-free counter 310 are non-zero is the data subunit determined to be bistable.

Figure 8:
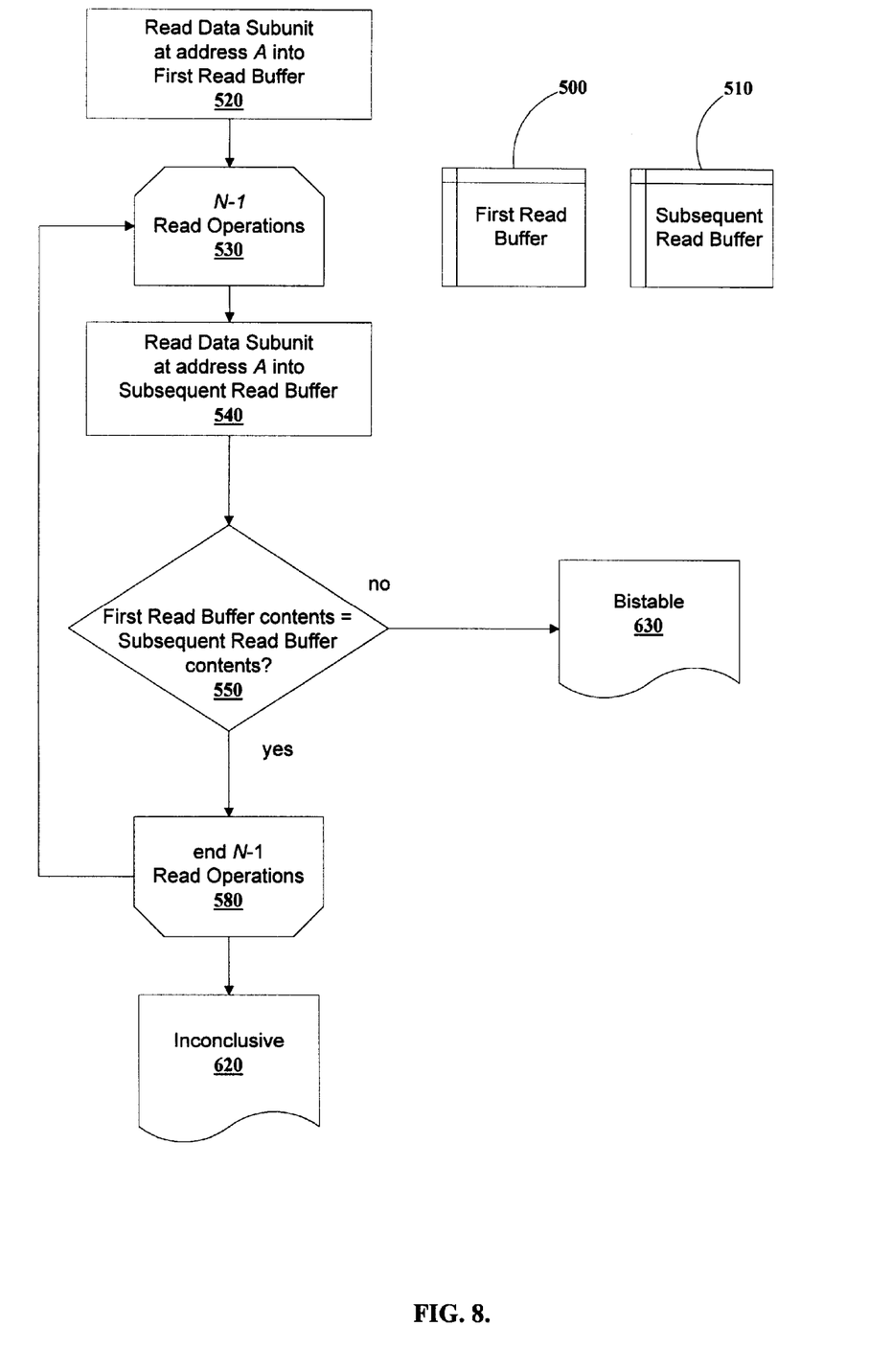
FIG. 8 is a flowchart showing the steps in determining data subunit stability by multiple reading operations to check for data.

FIG. 8 is a flowchart showing the steps of another embodiment according to the present invention for determining the stability of a data subunit of the data subunit at address A. This embodiment also utilizes multiple read operations, but instead of classifying the outcome of the individual read operations as "error-free" or "error", the values of the read data are used. The values of the read data for the different read operations are compared, and if there are any differences, then the data subunit is determined to be bistable. The present applicants have determined that certain players return an indication of "error-free" reading, but nevertheless fail to perfectly correct the erroneous data of the bistable data subunit. Therefore, it is possible with these players to detect a bistable data subunit. Therefore, it is possible with these players to detect a bistable data subunit by comparing the data read. Otherwise, if all the read operations result in identical data, the test is inconclusive. In this example, the test is performed by having a first read buffer 500 and a subsequent read buffer 510. The data from reading the data subunit at address A is loaded into first read buffer 500 in a read operation 520. Within loop 530–580 there is a read operation 540 which reads the data subunit at address A and loads the data into subsequent read buffer 510. Following is a decision point 550 where the data stored in first read buffer 500 is compared with the data stored in subsequent read buffer 510. If the data in first read buffer 500 differs from that of the data in subsequent read buffer 510, then the test determines that the data subunit is bistable in result 630. At the end of loop 530–580, the test is deemed inconclusive in a result 620.

Figure 9:
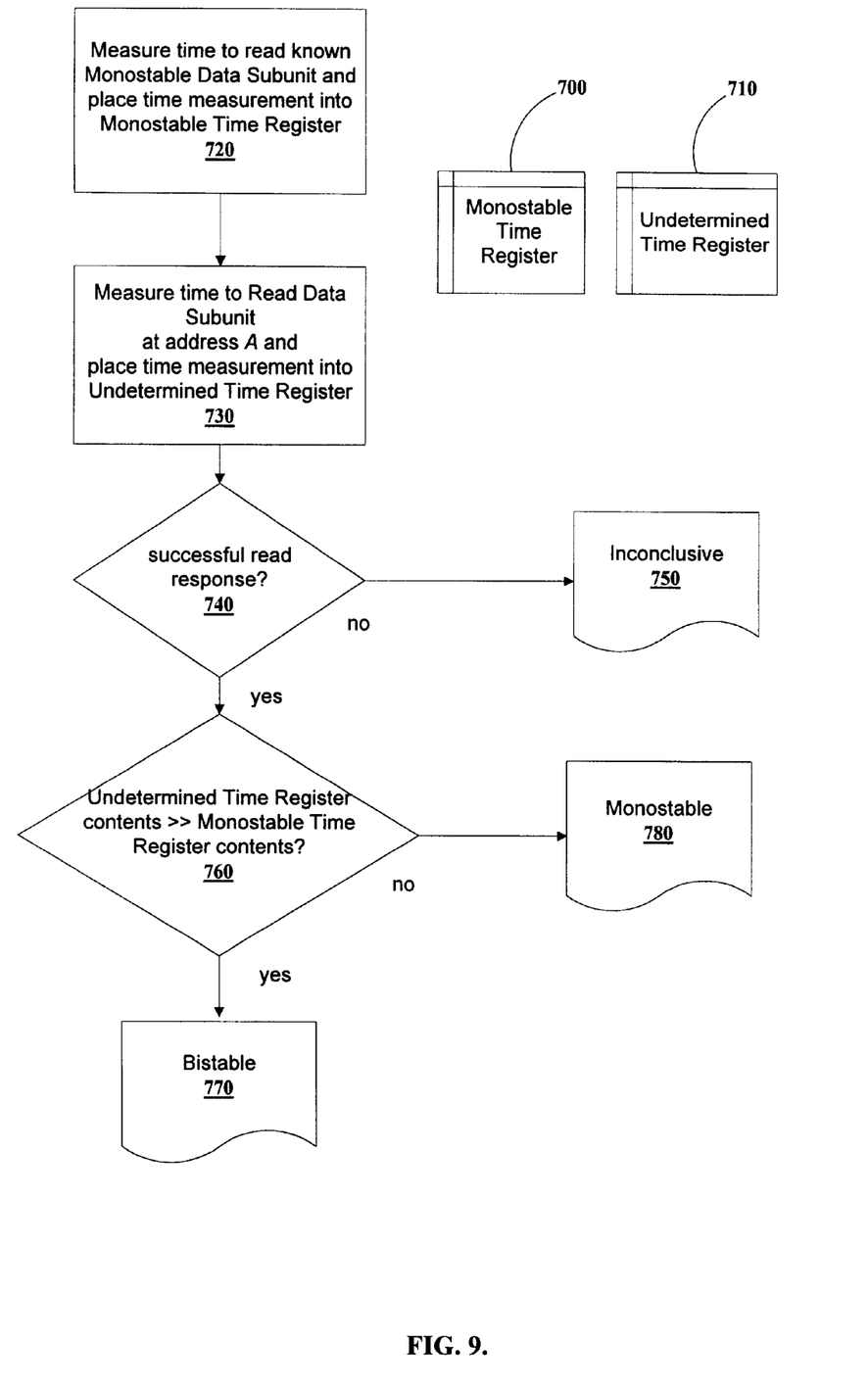
FIG. 9 is a flowchart showing the steps in determining data subunit stability by timing measurements.

FIG. 9 is a flowchart showing the steps of yet another embodiment according to the present invention for determining the stability of a data subunit of the data subunit at address A. This embodiment utilizes timing measurements for a single read operation. There are two registers for storing time measurements, a monostable time register 700 and an undetermined time register 710. At a time measurement step 720, a measurement is made of the elapsed time required to read a known monostable data subunit, and this time measurement is placed in monostable time register 700. Then, at a time measurement step 730, a measurement is made of the elapsed time required to read the data subunit at address A, and this time measurement is placed in undetermined time register 710. Next, at a decision point 740 if the read operation in time measurement step 730 is not a successful read response, the test terminates as inconclusive at a result 750. Otherwise, at a decision point 760, the contents of undetermined time register 710 are compared against that of monostable time register 700. If the contents of undetermined time register 710 are substantially greater than the contents of monostable time register 700, then the test determines that the data subunit is bistable in a result 770. Otherwise, if the contents of undetermined time register 710 are not substantially greater than the contents of monostable time register 700, then the test determines that the data subunit is monostable in a result 780. A first time measurement $\tau_1$ is herein defined to be "substantially greater than" a second time measurement $\tau_2$ if the ratio $\tau_1/\tau_2$ is of the order of at least 1.5.

Figure 10:
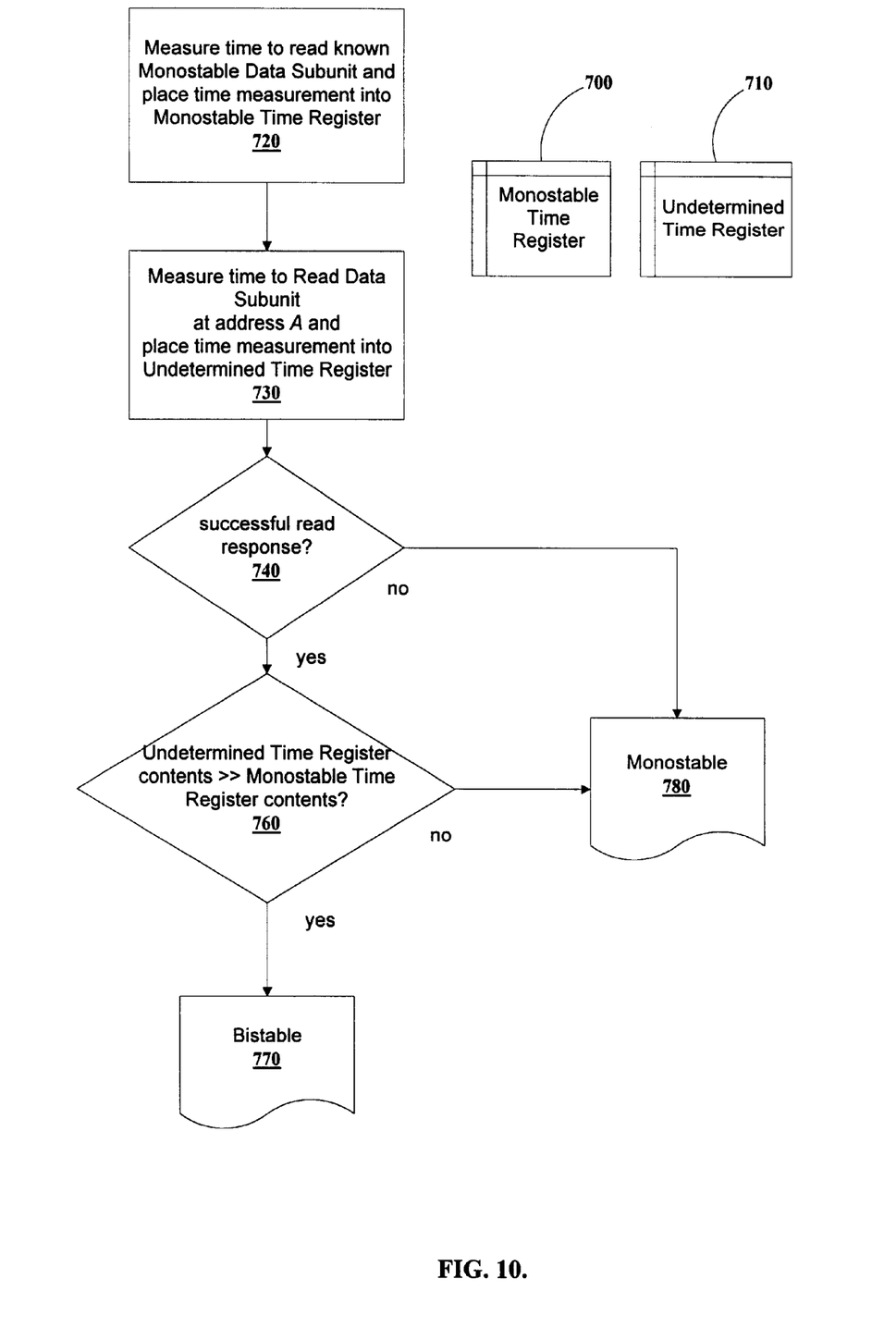
FIG. 10 is a flowchart showing the steps in an alternative determination of data subunit stability by timing measurements.

FIG. 10 is a flowchart showing the steps of an embodiment according to the present invention, similar to that shown in FIG. 9, except that at decision point 740, if the read operation in time measurement step 730 is not a successful read response, then the test determines that the data subunit is monostable in result 780. In all other respects, the steps are the same as shown in FIG. 9.

Combinations of the tests described above can also be used. For example, a data read test (FIG. 8) can be employed, and if this test is inconclusive, an error test (FIG. 7) can be then invoked to resolve the issue.

While the invention has been described with respect to a limited number of embodiments, it will be appreciated that many variations, modifications and other applications of the invention may be made.

What is claimed is:

1. A method for authenticating an undetermined digital optical medium corresponding to an original digital optical medium, comprising the steps of:

(a) writing at least one addressable bistable data subunit on the original digital optical medium, said addressable bistable data subunit having a predetermined address;

(b) testing the stability of an addressable data subunit of the undetermined digital optical medium having the same address as said predetermined address; and (c) determining the undetermined digital optical medium to be an original digital optical medium if the result of said testing is that said stability is bistable, and determining the undetermined digital optical medium to be an unauthorized copy if the result of said testing is that said stability is monostable.

2. The method as in claim 1, wherein said bistable data subunit is a bistable error-correction data subunit.

3. The method as in claim 2, said addressable bistable error-correction data subunit containing data symbols and having a predetermined error-correction limit, and wherein said writing at least one addressable bistable data subunit on the original digital optical medium comprises the steps of:

(a) selecting a group of data symbols in said addressable bistable error-correction data subunit, the number of data symbols in said group being greater than the predetermined error-correction limit;

(b) selecting a first subgroup consisting of at least one data symbol of said group;

(c) selecting a second subgroup consisting of the complement of said first subgroup in said group;

(d) replacing all of the data symbols of said first subgroup with bistable data symbols; and (e) replacing all of the data symbols of said second subgroup with erroneous data symbols.

4. The method as in claim 3, wherein the number of data symbols in said group equals the predetermined error-correction limit plus one and wherein said first subgroup consists of exactly one data symbol of said group.

5. The method as in claim 3, wherein said first subgroup contains all the data symbols of said group and said second subgroup is empty.

6. The method as in claim 1, wherein said testing comprises the following steps:

(a) making a plurality of attempts to read a selected one of said at least one addressable bistable data subunit from the undetermined digital optical medium;

(b) classifying the outcome of each of said plurality of attempts as one of a group of potential responses; and (c) determining the result of said testing to be:
i) bistable, if said outcomes of said plurality of attempts are of more than one different classification; and
ii) monostable, if said outcomes of said plurality of attempts are of the same classification.

7. The method as in claim 1, wherein said testing is performed on a player operative to multiple retry reading, said testing comprising the following steps:

(a) reading a addressable monostable data subunit from the undetermined digital optical medium and measuring a first time interval required for said player to return an outcome;

(b) attempting to read a selected one of said at least one addressable bistable data subunit from the undetermnined digital optical medium and measuring a second time interval required for said player to return an outcome;

(c) classifying the outcome of said attempting as being one of a group of potential responses, said group including a successful read response; and (d) determining the result of said testing to be:
  i) monostable, if the classification of said outcome is not said successful read response;
  ii) bistable, if the classification of said outcome is said successful read response and if said second time interval is substantially greater than said first time interval; and
  iii) monostable, if the classification of said outcome is said successful read response and if said second time interval is not substantially greater than said first time interval.

8. The method as in claim 1, wherein said testing is performed on a player operative to multiple retry reading, said testing comprising the following steps:
  (a) reading a addressable monostable data subunit from the undetermined digital optical medium and measuring a first time interval required for said player to return an outcome;
  (b) attempting to read a selected one of said at least one addressable bistable data subunit from the undetermined digital optical medium and measuring a second time interval required for said player to return an outcome;
  (c) classifying the outcome of said attempting as being one of a group of potential responses, said group including a successful read response; and
  (d) determining the result of said testing to be:
    i) inconclusive, if the classification of said outcome is not said successful read response;
    ii) bistable, if the classification of said outcome is said successful read response and if said second time interval is substantially greater than said first time interval; and
    iii) monostable, if the classification of said outcome is said successful read response and if said second time interval is not substantially greater than said first time interval.

* * * * *